Aug. 27, 1963
A. I. PRESSMAN
3,102,209
TRANSISTOR-NEGATIVE RESISTANCE DIODE
SHIFTING AND COUNTING CIRCUITS
Filed March 29, 1960
4 Sheets-Sheet 1

INVENTOR.
ABRAHAM I. PRESSMAN
BY John V. Regan
ATTORNEY

INVENTOR.
ABRAHAM I. PRESSMAN
BY John V. Regan
ATTORNEY

INVENTOR.
ABRAHAM I. PRESSMAN
BY John V. Regan
ATTORNEY

INVENTOR.
ABRAHAM I. PRESSMAN
BY John V. Regan
ATTORNEY

United States Patent Office 3,102,209
Patented Aug. 27, 1963

3,102,209

TRANSISTOR-NEGATIVE RESISTANCE DIODE SHIFTING AND COUNTING CIRCUITS

Abraham I. Pressman, Philadelphia, Pa., assignor to Radio Corporation of America, a corporation of Delaware Filed Mar. 29, 1960, Ser. No. 18,426
11 Claims. (Cl. 307—88.5)

This invention relates to bistable circuits, and particularly to bistable circuits using negative resistance diodes and transistors.

In certain applications, bistable circuits using negative resistance diodes alone have disadvantages resulting mainly from the two terminal nature of the diode. Among these disadvantages are the lack of isolation between input and output signals, the problem of controlling the direction of information flow, and the problem of inverting a signal received at the input to its complement. These problems can be overcome as described more fully hereinafter by employing the negative resistance diode as a bistable element and coupling the diode to one of the control electrodes of a transistor. The state of the diode then directly controls the conduction state of the transistor. Circuits of this type can be arranged to provide inverting or complementing devices, flip-flop devices and shifting devices such as ring counters, binary counters, shift registers and the like devices.

It is the object of the present invention to provide improved bistable circuits using negative resistance diode elements and transistors.

Another object of the invention is to provide improved flip-flop circuits using negative resistance diodes and transistors.

Another object of the present invention is to provide improved shifting type circuits using negative resistance diodes and transistors to control the shifting of one or more information signals.

A further object of the present invention is to provide improved shifting circuits in which novel gating arrangements are employed to control the shifting operation.

Each bistable circuit of the present invention includes a negative resistance diode having one electrode directly coupled to an input electrode of a transistor. In one diode state the transistor is cut off, in the other diode state the transistor is conducting. The output signal is taken from the transistor. A plurality of transistors and negative resistance diodes are interconnected with each other to provide novel flip-flop, counting and shifting circuits.

According to one feature of the invention, a pair of tunnel diodes is arranged to control a pair of transistor devices to provide a bistable circuit operating to produce a pair of output signals corresponding to a signal and its complement.

According to another feature of the invention, a plurality of negative resistance diode-transistor circuits are interconnected with each other to provide counting and shift register circuits. By suitably connecting gating signals to the diodes the shifting circuits may be operated as ring counter, binary counter or shift register circuits.

Figure 1:
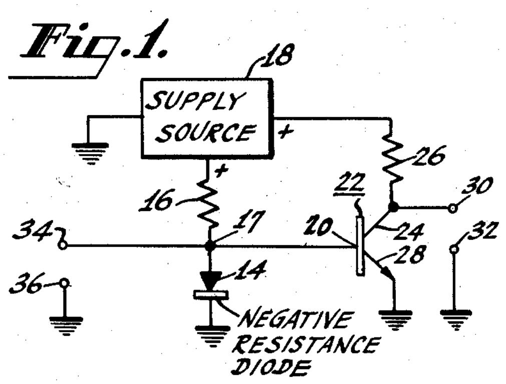
FIG. 1 is a schematic diagram of one embodiment of a negative resistance diode-transistor circuit useful in explaining the operation of the bistable circuits of the present invention.

In the circuit of FIG. 1 a negative resistance diode 14 has its anode connected through a suitable load resistor 16 to a positive polarity output of a supply source 18. The diode 14 anode is also directly coupled at a junction point 17 to the base electrode 20 of a transistor 22. The transistor 22 has its collector anode 24 connected through a load resistor 26 to a positive polarity output of supply source 18. The emitter electrode 28 of the transistor 22 is connected to a point of common reference potential, indicated in the drawing by the conventional ground signal. The circuit output is taken across the collector electrode 24 of the transistor 22 by means of a pair of output terminals 30, 32. Input signals are applied across the negative resistance diode 14 by means of a pair of input terminals 34, 36 connected respectively to the anode of the diode 14 and to ground.

For purposes of illustration, the transistor 22 is of the NPN conductivity type. In such case, the diode 14 is poled for easy direction of current flow from the junction point 17 to ground. If desired, a transistor of the PNP conductivity type may be employed. In such case, the diode is poled for easy direction of current flow from ground to the junction point 17 and the supply source 18 is arranged to provide a negative supply potential. The negative resistance diode 14 may be a so-called "tunnel diode" as described in an article by H. Sommers appearing in the Proceedings of the IRE, July 1959, page 1201.

Figure 2:
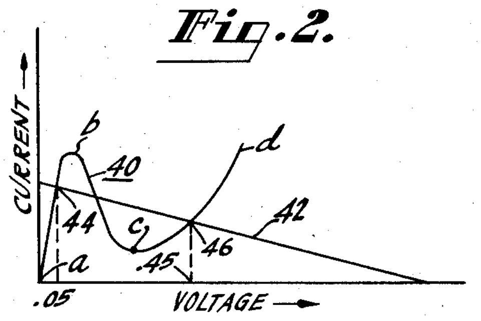
FIG. 2 is a graph of the current-voltage characteristic of a negative resistance diode useful in the present invention.

A characteristic I—V curve 40 for a tunnel diode is shown in FIG. 2. In FIG. 2 the voltage V applied to the diode is plotted along the abscissa and the resulting current I is plotted along the ordinate. As discussed in the Sommers article the regions of the curve between the points *ab* and *cd* are regions of positive resistance. The region between the points *b* and *c* is one of negative resistance. The load resistor 16 is arranged to provide a load line 42 which intersects both the positive resistance regions of the diode at the points 44 and 46. The load line 42 also intersects the negative resistance region of the diode. This latter intersection is a point of unstable operation and the diode will switch to one of the two stable operating points 44 or 46. For a germanium type diode, the intersection 44 has a value of about .05 volt and the point 46 corresponds to a value of about .45 volt. The current and voltage values of the characteristic curve, of course, differ for diodes of different semiconductive materials, although the curve shape remains substantially the same. Accordingly, these two operating points 44, 46, corresponding to the load line intersection, are termed the "low" and "high" states of the diode. The diode is changed or set from the low voltage state to the high voltage state by applying a positive polarity signal across the input terminals 34 and 36. Upon termination of the input pulse, the diode remains at its "high" state. The diode is changed or "reset" from its "high" to its "low" state by applying an opposite polarity pulse across the input terminals 34, 36. This pulse, for example, in FIG. 1 may be a negative polarity pulse. Upon termination of the negative polarity pulse, the diode remains at the low voltage state corresponding to the point 44 of the curve 40. The two possible conditions of the diode namely "high" and "low" are used to designate the two binary digits "1" and "0," respectively.

Figures 3, 4, 5:
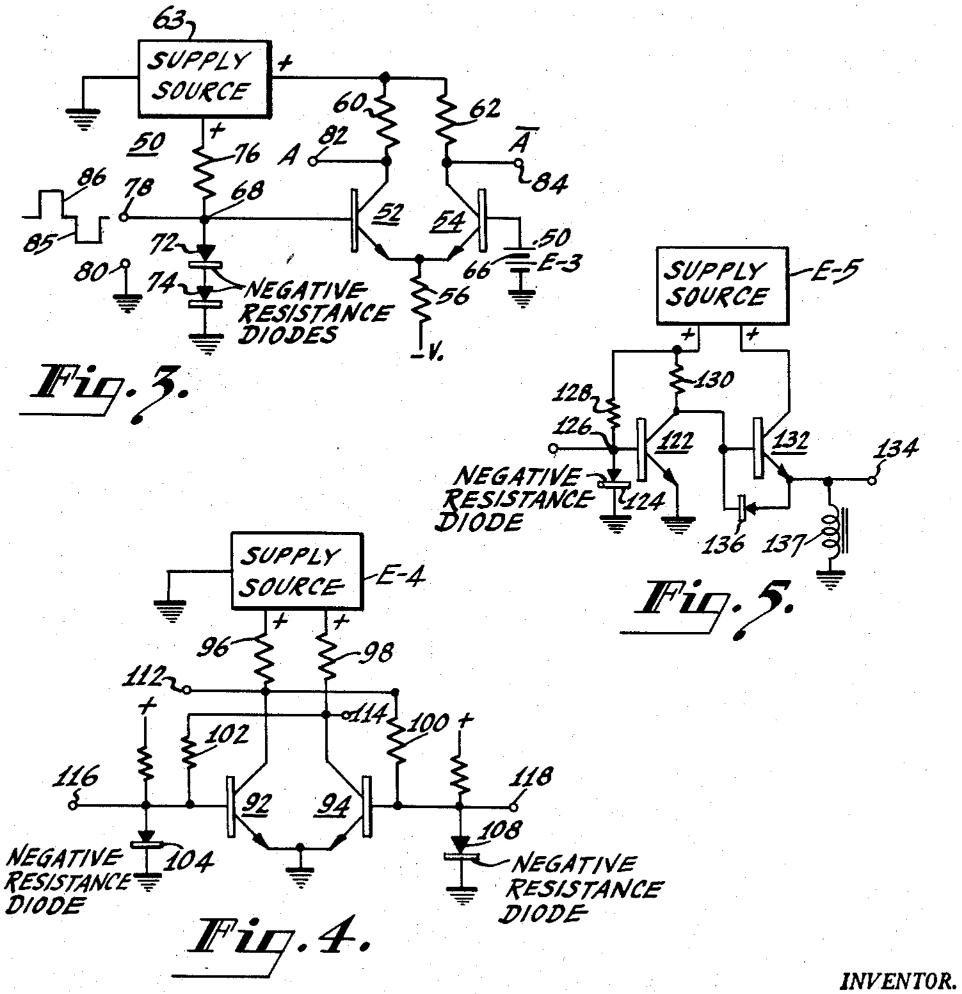
FIG. 3 is a schematic diagram of another negative resistance diode-transistor circuit useful in the circuits of the present invention.
FIG. 4 is a schematic diagram of a circuit arrangement according to the invention of the complementing type.
FIG. 5 is a schematic diagram of a bistable circuit according to the invention capable of providing a relatively large output signal.

The circuit 50 of FIG. 3 is a complementing circuit which provides at the same time a pair of outputs A and its complement $\bar{A}$ (not A). The circuit 50 provides a relatively high level output signal A and a relatively low output signal $\bar{A}$ upon receipt of an input pulse of one polarity, for example negative, and the output signals A and $\bar{A}$ are reversed to relatively low and high levels, respectively, upon receipt of a positive polarity input pulse. The circuit 50 includes a pair of transistors 52, 54, having their emitters connected through a common emitter resistor 56 to the negative terminal of a supply source —V. The collector electrodes of the transistors 52, 54 are connected through separate collector resistors 60, 62 to the positive terminal of a supply source 63. The source 63 is also provided with a ground connection. The base electrode of the transistor 54 is biased in the forward direction by means of a bias source E–3, indicated by the battery 66. The negative terminal of the battery 66 is connected to ground. If desired, a common supply source may be used for the separate supply and bias sources. The base electrode of the first transistor 52 is connected to an input junction point 68. A pair of tunnel diodes 72, 74 are connected in series with each other between the junction point 68 and ground. A load resistor 76 for the diodes 72, 74 is connected between the junction point 68 and a positive terminal of the supply source E–2. The diodes 72, 74 are poled for easy direction of current flow from the junction 68 to ground. A pair of input terminals 78, 80 are connected across the diodes 72, 74. The pair of output signals A and $\bar{A}$ are taken by way of output terminals 82, 84 connected to the collector electrodes of the transistors 52, 54, respectively.

In operation, assume the tunnel diodes 72, 74 are initially placed in their "low" voltage states as by applying a negative polarity, input pulse 85 across the tunnel diodes. Following a negative input pulse 85, the transistor 54 is held conducting due to the bias source E–3.

Substantially all the supply current from the source 63 flows through the collector-emitter path of the conducting transistor 54. The current flow through the common-emitter resistor 56 applies a reverse bias to the emitter-base diode of the transistor 52 holding that transistor cut off. For this condition of the circuit, a relatively small voltage $\bar{A}$ appears across the output terminal 84 and a relatively large voltage A appears across the output terminal 82 indicating the absence of a positive input signal.

The circuit remains in the initial condition until a positive polarity input pulse is applied across the tunnel diodes. When a positive polarity input pulse 86 is applied across the diodes 72, 74, both change from the "low" to the "high" voltage state and a relatively large base input signal (of approximately 0.9 volt) is applied to the first transistor 52. The relatively large input signal applies a reverse bias across the emitter-base diode of the transistor 54. The transistor 54 then changes from a conducting, to a non-conducting condition and substantially all the supply current from the source 63 flows through the collector-emitter path of the transistor 52. The transistor 52 is held in the "on" condition by the tunnel diodes 72, 74 even after the positive input pulse is terminated. The second transistor 54 is held in the "off" condition due to the reverse bias voltage applied to its emitter-based iode. Thus in the second circuit condition, a relatively large output signal $\bar{A}$ appears across the output terminal 84, and a relatively small signal A appears across the output terminal 82. The large signal $\bar{A}$ at the output terminal 84 indicates the receipt of the positive input signal which, for example, may correspond to a binary "1" information signal.

Each time the polarity of the input signal changes, the circuit conditions reverse. Note that a relatively small input signal of a few milliamperes can control a relatively large output signal of a few hundred milliamperes. Preferably, the bias source E–3 is arranged so that the upper terminal of the common emitter resistor swings symmetrically above and below the bias potential of the source E–3 to reverse bias the one or the other of the tansistors 54, 52 to non-conduction. For commercially available transistors having a base-emitter voltage drop of about 0.3 volt, a bias potential of about 0.5 volt is suitable.

Another embodiment of a complementing circuit is shown in FIG. 4. The circuit of FIG. 4 also includes a pair of transistors 92, 94 which may be of NPN type. The emitter electrodes of both the transistors are connected directly to ground. The collector electrodes are connected through separate collector resistors 96, 98 to the positive terminals of a supply source E–4. The collector electrode of the first transistor 92 is resistor coupled by means of a resistor 100 to the base electrode of the second transistor 94. The collector electrode of the second transistor 94 similarly is resistor coupled to the base electrode of the first transistor 92 by means of a resistor 102. A first tunnel diode 104 connects the base electrode of the first transistor 92 to ground. The base electrode of transistor 94 is similarly coupled to ground by a second tunnel diode 108. A pair of output terminals 112 and 114 are connected to the collector electrodes of the first and second transistors 92 and 94, respectively. Separate input terminals 116 and 118 are connected across the first and second tunnel diodes 104 and 108. If desired, both input terminals 116, 118 may be connected together to receive common input pulses. Each of the tunnel diodes 104 and 108 is poled for easy, that is, forward direction of current flow from the connected input terminal 116 and 118 to ground.

In operation, one of the tunnel diodes, for example the first diode 104, is in the "high" voltage state and the other diode 108 is in the "low" voltage state. The transistor 92 connected to the "high" voltage state diode 104 is in the "on" condition and the transistor 94 is in the "off" condition. A relatively large amplitude output signal then appears across the one output terminal 114 connected to the "off" transistor 94.

Application of a positive input pulse to both the input terminals 116, 118 changes the tunnel diode 108 from the "low" voltage state to the "high" voltage state. A relatively large positive voltage is coupled to the base of the "off" transistor 94 causing this transistor to change to the "on" condition. The positive input pulse does not appreciably change the other diode 104 which is already in its "high" state. The collector of the previously "off" transistor 94 falls from the supply potential towards ground and a relatively large negative going signal is coupled to the anode of the tunnel diode 104 changing this tunnel diode from the initial "high" to the "low" voltage state. The tunnel diode 104 then applies a relatively small base input signal to the transistor 92 changing this transistor from the "on" to the "off" condition. The switching of the transistors 92 and 94 between their two states is a regenerative process, as in known Eccles-Jordan type bistable circuits.

Note that unlike prior transistor circuits, the circuits of FIGS. 3 and 4 are substantially independent of the waveshape, amplitude and duration of the input signals. Thus all that is reqiured is that the input signal provide a minimum current amplitude sufficient to drive the intersection point 44 representing the tunnel diode in the "low" state past the point *b* of the characteristic curve of FIG. 2.

Upon termination of the positive input pulse, the output terminal 112 is at a high level and the output terminal 114 is at a low level. A new positive input signal causes the output terminals 112 and 114 to reverse from relatively high and low levels to relatively low and high levels, respectively, and so on for successive input pulses.

The circuit 120 of FIG. 5 operates in the manner of a so-called "latching relay" circuit. That is, a momentary input current signal of relatively small amplitude provides a relatively large output signal current which remains until a new input signal of opposite polarity is applied. The circuit 120 includes an input transistor 122 having its base electrode coupled to ground by means of a tunnel diode 124. Input signals are applied at a junction 126 between the tunnel diode 124 and the transistor 122. A load resistor 128 couples the tunnel diode 124 to the positive terminal of a supply source E–5. The supply source E–5 also is provided with a ground connection. A collector resistor 130 couples the collector of the transistor 122 to the positive terminal of the supply source E–5. The emitter electrode of the transistor 122 is connected to ground. An output transistor 132 is directly coupled as an emitter follower to the collector of the first transistor 122. The collector electrode of the output transistor 122 is connected to the positive terminal of the supply source E–5. The emitter electrode of the output transistor 132 is connected to ground via a load, shown as a relay coil 137. A diode 136 is connected between the load terminal 134 and the collector of the input transistor 122. For transistors of the NPN type as illustrated in the drawing, the tunnel diode 124 is poled for easy direction of current flow from the junction 126 to ground, and the discharge diode 136 is poled for easy direction of current flow from the load terminal 134. The first transistor 122 is a high frequency, low current amplifying type transistor, such as a 2N234; the output transistor 132 is a low frequency, power transistor such as a 2N174.

In operation, assume the tunnel diode 124 is initially set in the "low" state thereby causing the first transistor 122 to be in the "off" condition. Its collector electrode is at a relatively high positive potential. The latter positive potential is applied to the base of the output transistor 132 holding the output transistor in the "on" condition to produce a relatively large current flow through the relay coil 137. The circuit is held in the initial state by the tunnel diode 124.

Application of a momentary positive pulse to the circuit input changes the tunnel diode 124 from the initial "low" to the "high" voltage state causing the first transistor 122 to change from the "off" to the "on" condition. A negative going pulse is coupled to the base electrode of the output transistor 132 changing this transistor from the "on" condition to the "off" condition. The discharge diode 136 provides a discharge path for the load current via the collector-emitter path of the input transistor 122. In the absence of the diode 136 there would be no low resistance discharge path provided for energy stored in the relay coil 137. When the input transistor 122 changes to the "on" condition, the discharge diode 136 becomes forward biased. The low impedance discharge path is provided from the relay coil 137 through the discharge diode 136, in the forward direction, and through the collector-emitter path of the input transistor 122 back to the relay coil 137. The output transistor 132 is held reversed-biased while the tunnel diode 124 remains in the "high" state and substantially no current flows in the relay coil 137. Again it should be noted that a current pulse, uncritical in waveshape and duration and of relatively small amplitude operates to control a relatively heavy output current which may be the order of an ampere or larger.

Figure 6:
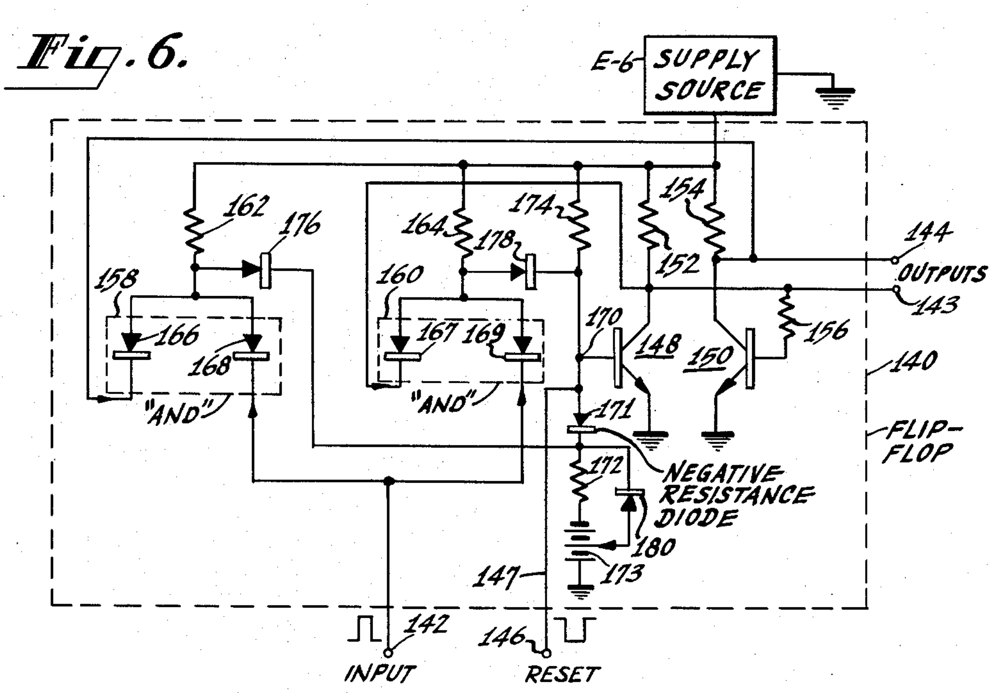
FIG. 6 is a schematic diagram of a flip-flop circuit according to the invention.

A triggerable flip-flop 140 as shown in FIG. 6 includes a pair of transistors 148, 150 each of which may be of the NPN type. The collector electrodes of the transistors 148, 150 are connected via separate resistors 152, 154 to the positive terminal of a supply source E–6. The collector electrode of the transistor 148 is also D.C. (direct current) coupled to the base of the transistor 150 via a coupling resistor 156. The emitter electrodes of both transistors are connected to ground. A first output terminal 143 of the flip-flop is connected to the collector electrode of the first transistor 148, and a second output terminal 144 is connected to the collector electrode of the second transistor 150.

The triggering of the flip-flop is controlled by a pair of two-input diode "and" gates 158, 160. The anodes of both diodes of the "and" gates 158, 160 are connected via separate load resistors 162, 164 to the positive terminal of the supply source E–6. First inputs are applied to the cathodes of the first diodes 166 and 167 of the "and" gates by the collector potentials of the first and second transistors 148 and 150 to which the first diodes are connected respectively. The cathodes of the second diodes 168, 169 of both "and" gates 158, 160 are connected to a trigger input lead 142. The base electrode of the first transistor 148 is connected at a junction point 170 to the series combination of a tunnel diode 171 and a bias resistor 172 to the negative terminal of a bias source, indicated by the battery 173. The positive terminal of the bias source 173 is connected to ground. A load resistor 174 connects the tunnel diode 171 to the positive terminal of the supply source E–6. If desired, a common supply may be used for source E–6 and the bias source 173. The output of the first "and" gate 158 is coupled to the cathode electrode of the tunnel diode 171 by a unilateral conducting device such as the diode 176. The output of the second "and" gate 160 is coupled to the anode of the tunnel diode 171 by a unilateral conducting device, such as a diode 178. A clamp diode 180 is connected across the resistor 172 to clamp the cathode of the tunnel diode at a relatively small, positive potential to prevent the application of excessive positive voltage to the cathode of the tunnel diode 171. A reset lead 147 connects a reset terminal 146 to the anode of the tunnel diode 170.

In operation, assume the flip-flop is in the reset condition with the tunnel diode 171 in the "low" state, the first transistor 148 in the "off" condition and the second transistor 150 in the "on" condition. The flip-flop can be placed in the reset condition by applying a negative polarity reset pulse to a reset terminal 146. In the reset state, the collector electrode of the first transistor 148 is relatively high and the first diode 167 of the second "and" gate 160 is biased to non-conduction. At the same time, the relatively low voltage at the collector of the second transistor 150 operates to bias the first diode 166 of the first "and" gate 158 to conduction. The second diodes of each of the "and" gates 158 and 160 are normally conducting since the input terminal 142 is normally at ground potential. Thus, the first "and" gate 158 is inhibited due to the forward bias on its first diode, and the second "and" gate 160 is enabled due to the reverse bias on its first diode. However, at this time both "and" gates 158 and 160 provide a relatively low output signal due to the conducting second diodes. This low output does not produce any appreciable current flow through either one of the coupling diodes 176, 178 due to their non-linear characteristics.

Application of a positive input pulse to the trigger input 142 causes both second diodes of the "and" gates 158 and 160 to change to the non-conducting condition. The output of the enabled first "and" gate 160 then changes from a relatively low to a relatively high potential, and a positive going pulse is coupled by the coupling diode 178 to the anode of the tunnel diode 171. The tunnel diode 171 is thereby changed from its "low" to its "high" voltage state. The output potential of the first "and" gate 158 remains at a relatively low potential due to the continued conduction of the first diode 166. In the "high" voltage state, the tunnel diode 171 applies a large positive base input signal to change the first transistor 148 from the "off" to the "on" condition. The collector electrode of the first transistor 148 then changes from a relatively "high" to a relatively "low" voltage, and the negative going collector potential is coupled to the base of the second transistor 150 to change this transistor from the "on" to the "off" condition. Upon termination of the positive input pulse, tunnel diode 171 is in its "high" voltage state, the first transistor 148 is in the "on" condition, and the second transistor 150 is in the "off" condition. The first "and" gate 158 is now enabled due to the reverse bias applied to its first diode 166 by the collector potential of the second transistor 150. The second "and" gate 160 is inhibited due to the forward bias applied to its first diode 167.

When a second positive input pulse is applied to the trigger input 142, the enabled first "and" gate 158 provides a positive going output pulse which is coupled by the coupling diode 176 to the cathode of the tunnel diode 171. This positive pulse causes the tunnel diode 171 to change from the "high" to the "low" voltage state. The first transistor 148 then changes from the "on" to the "off" condition, and the second transistor 150 changes from the "off" to the "on" condition. Thus the second input pulse causes the voltage levels of the output terminals 143, 144 to reverse with a relatively large level signal provided at the output terminal 143 and a relatively low level signal provided at the output terminal 144. Thus, for each two successive input pulses applied to the trigger input 142, a single positive output pulse is produced on the output lead 143 of the flip-flop, and a complementary negative pulse is produced at the output lead 144.

Figure 7:
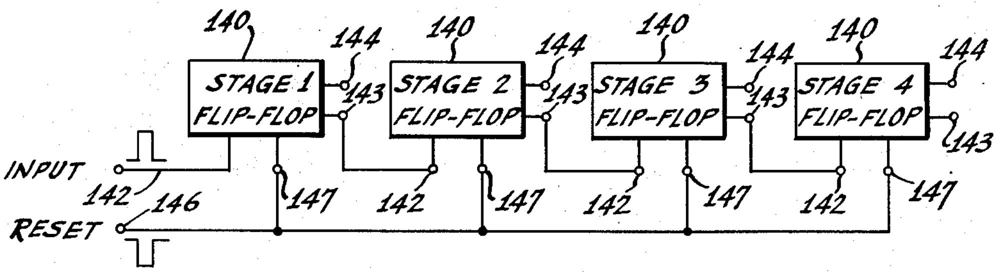
FIG. 7 is a schematic diagram of a binary counter circuit using flip-flop circuits of FIG. 6.

A plurality (*n*) of triggerable flip-flops according to FIG. 6 may be arranged in cascade to provide an "*n*" stage binary counter as shown in FIG. 7. The output lead 143 of the "*n*th" counter stage is connected to the trigger input 142 of the $n+1$th counter stage. Each of the flip-flop circuits 140 of FIG. 7 is similar to the circuit of FIG. 6 The input pulses to be counted are applied to the trigger input 142 of the first counter stage. Thus, for example, four of the counter stages 140 provide an output signal at the output lead 143 of the fourth stage upon the receipt of 16 input signals. The input signals may be applied in periodic or random fashion. The counter may be reset to an initial condition by applying a reset signal to a common reset terminal 146 which is connected in parallel to the reset leads 147 of each of the flip-flops 140.

The binary counter of FIG. 7 may be changed to a decade counter by coupling the output 143 of the fourth stage to the inputs 142 of the second and third stages. These two additional inputs are feedback inputs to arbitrarily add a count of six to the counter at the start of each operation. Thus, the decade counter produces an output signal after each 10 input signals.

Figure 8:
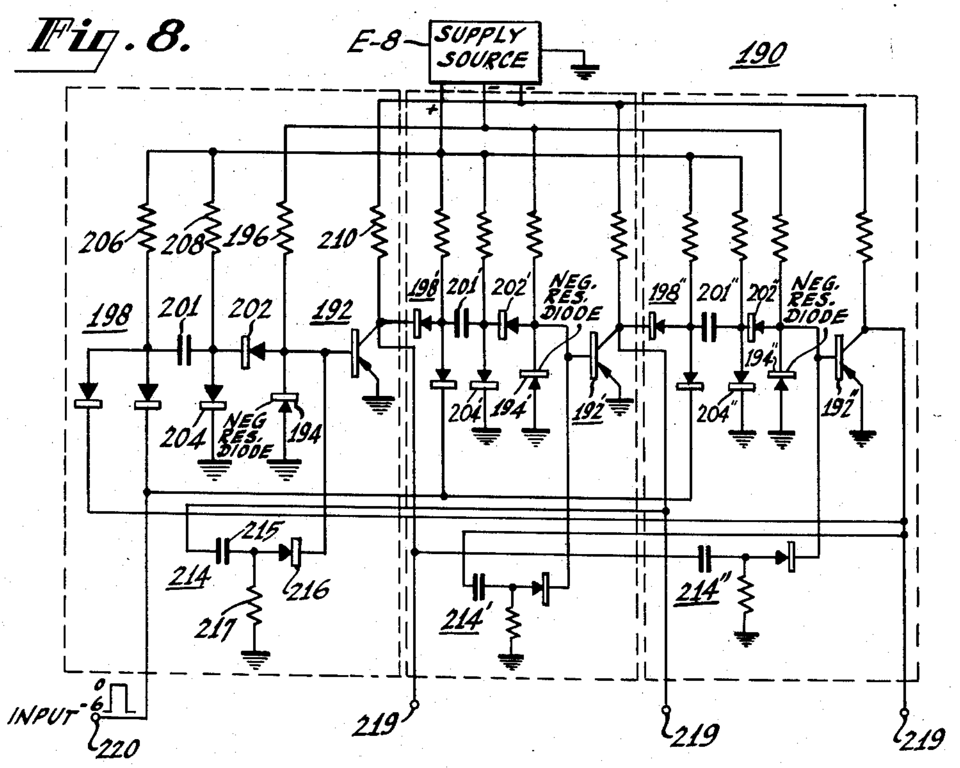
FIG. 8 is a schematic diagram of one embodiment of a ring counter according to the invention.

A ring counter circuit 190 according to the invention is shown in FIG. 8. The ring counter 190 operates to produce an output of one kind, for example a high level voltage, at one of the counter stages and an output of the other kind, a low level voltage, at each of the other stages. By way of example, the ring counter 190 has three stages. Each of the stages is similar to the other, so only the first stage is described in detail. Primed numerals are used where necessary to identify elements of the second and third stage. A transistor 192 illustratively of the PNP type is set to either the "on" or the "off" condition in accordance with the state of a tunnel diode 194 having its cathode connected to the base of the transistor 192. A load resistor 196 connects the cathode of the tunnel diode 194 to a negative terminal of a supply source E–8. Another positive terminal of the supply source E–8 and the anode of the tunnel diode 194 each has a ground connection. The state of the tunnel diode 194 is controlled by the output of a two input "and" gate 198. The output of the "and" gate 198 is A.C. coupled via a capacitor 201 and a series diode 202 to the cathode of the tunnel diode 194. The series diode 202 is poled to pass a negative going pulse from the "and" gate output to the cathode of the tunnel diode 194. A clamp diode 204 is connected in shunt between the junction of the capacitor 201 and series diode 202 to ground. A common load resistor 206 connects the anodes of the "and" gate 198 diodes to the postive terminal of the supply source E–8. A load resistor 208 connects the anode of the clamp diode 204 to the positive terminal of the supply source E–8. The collector electrode of the transistor 192 is coupled by a collector resistor 210 to a negative terminal of the supply source E–8. The output of the first stage is taken at the collector electrode of the transistor 192 and is applied to the first diode of the two input "and" gate 198′ of the second stage.

The output of any one stage is A.C. coupled via a reset network 214 to the cathode of the preceding stage tunnel diode 194. Each network 214 includes a blocking capacitor 215, a diode 216, poled to pass a positive polarity signal from the third stage transistor 192 to the first stage tunnel diode 194, and a discharge resistor 217 connected between the capacitor 215 and diode 216 to ground.

In operation, one of the tunnel diodes, for example, the third stage tunnel diode 194″, is in its "high" state and the remaining tunnel diodes are in their "low" states. Accordingly, the third stage transistor 192″ is in the "on" condition and the remaining transistors are in the "off" condition. The relatively "high" level output of the third stage collector is connected to one input of the first stage diode "and" gate 198 as an enabling voltage. The relatively "low" level outputs of the other stages are applied as inhibiting inputs to the first diodes of the other "and" gates.

For this configuration of the counter, when a positive going input pulse is applied to the input terminal 220, the first stage diode "and" gate 198 is fully enabled causing the capacitor 201 connected to this "and" gate to rapidly charge to a positive value determined by the amplitude of the input pulse. The charging path for the capacitor 201 includes the supply source E–8, the resistor 206, the capacitor 201 and the shunt diode 204, back to the source E–8. Each of the other "and" gates is unaffected by the input pulse due to the continued conduction of their first diodes. The amplitude of the input pulse is made sufficiently large so that the capacitor 201 is charged to a relatively high positive value during the period of the input pulse. At the trailing edge of the input pulse, the capacitor 201 is rapidly discharged and a negative going pulse is applied to the cathode of the first stage tunnel diode 194 causing this diode to change from the "low" to the "high" state. The discharge path for the capacitor 201 is from ground through the tunnel diode 194, the capacitor 201 and the "and" gate second diode. The sustaining current for the tunnel diode 194 is supplied from the supply source E–8 via the load resistor 196. Upon changing to the "high" state, the tunnel diode 194 supplies a relatively high negative base input signal to the first stage transistor 192 changing this transistor from the "off" to the "on" condition. As the first stage transistor changes to the "on" condition, a positive going signal at its collector is coupled via the third A.C. coupling circuit 214″ to the cathode of the third stage tunnel diode 194″ changing it from its "high" to its "low" state. A relatively "low" level signal is then applied to the base of the third stage transistor 192″ changing it from the "on" to the "off" condition.

Accordingly, upon termination of the first input pulse, the third stage tunnel diode 194″ and transistor 192″ have changed states as has the first stage tunnel diode 194 and transistor 192. The next positive input pulse applied to the input terminal 220 operates in similar manner to reverse the states of the first stage diode 194 and transistor 192, and to reverse the states of the second stage tunnel diode 194′ and transistor 192′, and so on for succeeding input pulses.

Figure 9:
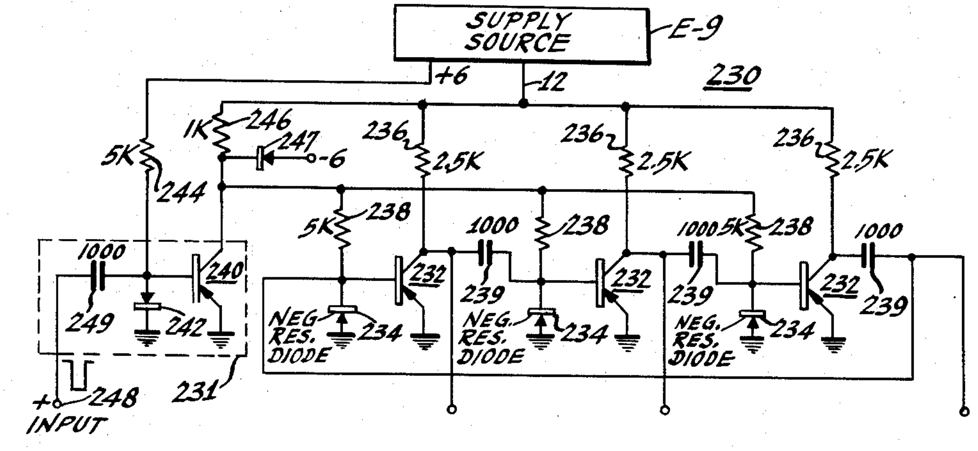
FIG. 9 is a schematic diagram of another embodiment of a ring counter according to the invention using a common gating arrangement.

Another embodiment of a ring counter according to the invention is shown in FIG. 9. The ring counter 230 of FIG. 9 uses a common gating stage 231 for all of the counter stages. For purposes of illustration, three counter stages are shown. Each of the stages includes a transistor 232 having a tunnel diode 234 connected to its base electrode and having a collector resistor 236 connected to a negative terminal of a supply source E–9. The source E–9 and the anode of the tunnel diode 234 each has a ground connection. The tunnel diodes are each provided with a separate load resistor 238. All the load resistors 238 are connected in parallel to the collector electrode of a gating transistor 240 of the gating stage 231. The collector of one counter transistor 232 is A.C. coupled via a capacitor 239 to the cathode of the succeeding tunnel diode 234. The third stage output is A.C. coupled to the first stage tunnel diode cathode. A clamp diode 242 clamps the base of the gating transistor 240 at a fixed positive voltage. A bias resistor 244 connects the clamp diode 242 between a positive terminal of the supply source E–9 and ground. The collector of the gating transistor 240 is connected through a load resistor 246 to the negative terminal of the supply source E–9. A clamp diode 247 clamps the collector of the gating transistor at a fixed negative voltage, say −6 volts. Suitable circuit values for the various components are indicated in the drawing. The capacitor values are in microfarads and the resistor values are in ohms. The collector resistor for the gating transistor is smaller in value than the collector resistors for the counter transistors in order to compensate for the parallel loading produced by the tunnel diodes.

Input pulses to be counted are of negative polarity and are applied to an input terminal 248 via a capacitor 249 to the base of the gating transistor 240. The input terminal is normally maintained at close to ground potential so that the gating transistor is normally "off" and its collector electrode is normally at −6 volts.

In operation one of the tunnel diodes is in the "high" state holding its connected transistor in the "on" condition. The remaining tunnel diodes are in their "low" states holding their connected transistors in the "off" condition. The input capacitor 249 and the base emitter diode of the gating transistor 240 act as a differentiating circuit producing a negative going pulse during the leading edge of each input pulse. The sustaining current for the tunnel diodes is supplied through the gate transistor collector resistor 246. Assume that the second stage tunnel diode 234 is in the "high" state. Application of a negative going input pulse drives the gating transistor 240 to the conducting condition; its collector rises from −6 volts towards ground thus removing the sustaining current to all the tunnel diodes 234. The second stage tunnel diode 234 then changes to the "low" state. The collector of the second stage transistor 234 then falls from ground towards −12 volts coupling a negative going pulse through the connected capacitor 239 to the following tunnel diode. The charging current for this capacitor flows from ground, through the third stage tunnel diode 234, the capacitor 239 and the collector resistor 236. This charging current changes the third stage tunnel diode to the "high" state coupling a relatively large negative potential to the base of the third stage transistor 232. Upon termination of the negative going part of the differentiated input pulse, the gating transistor 240 returns to the "off" condition and its collector falls from a slightly negative potential to a valve of −6 volts set by the clamp diode 247. This negative voltage then acts as a sustaining voltage for the third stage tunnel diode 234 holding this diode in the "high" state. The duration of the differentiated input pulse need only be long enough to permit the third stage tunnel diode 234 to change to the "high" state. Succeeding input pulses operate in similar manner to remove the sustaining voltage from the tunnel diode in the "high" state and to apply a switching and sustaining voltage to the succeeding stage tunnel diode.

Figure 10:
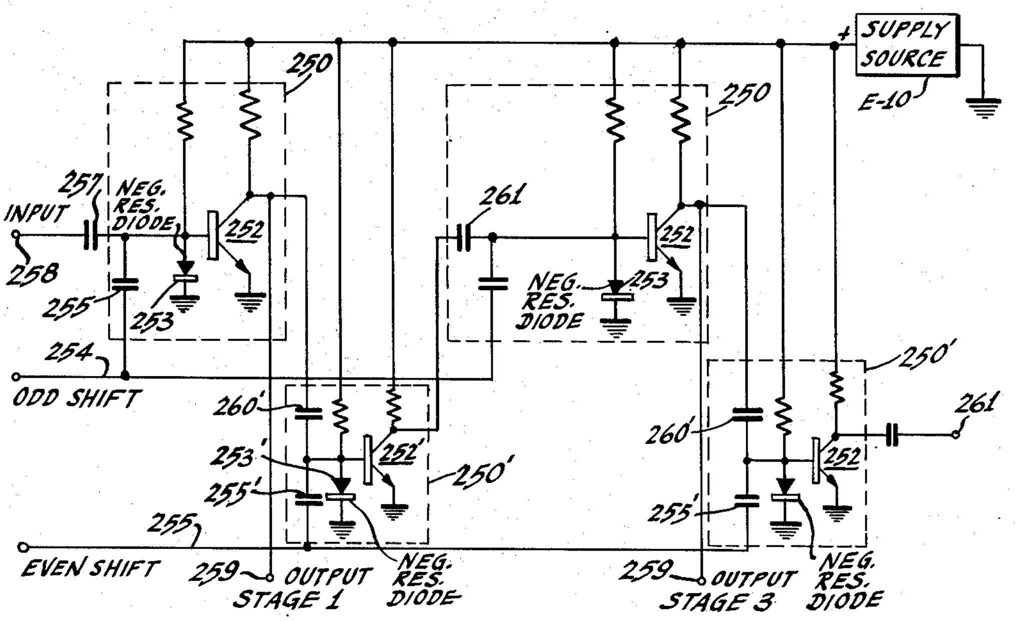
FIG. 10 is a schematic diagram of a shift register circuit according to the invention.

A shift register circuit according to the invention is shown in FIG. 10. For convenience of drawing, only four stages are shown, two odd stages 250 and two even stages 250′. The stages 250 of FIG. 10 are similar to those of FIG. 9 except that NPN type transistors 252 are used. A transistor 252 is in its "off" condition when the connected tunnel diode 253 in its base circuit is in the "low" state, and is in its "on" condition when the tunnel diode in its base circuit is in the "high" state. An odd shift bus 254 is A.C. coupled via a separate capacitor 255 to the tunnel diodes 253 of each odd numbered stage. An even shift bus 255 is A.C. coupled via a separate capacitor 255′ to the tunnel diode 253′ of each even numbered stage. The first shift register stage also has an input line A.C. coupled via a capacitor 257 to input terminal 258. A pair of output terminals 259 are coupled respectively, to the odd shift stages 252. The shift register stages are connected in an ordered arrangement by coupling capacitors. The collector electrodes of the odd stage transistors 252 are A.C. coupled via separate coupling capacitors 260′ to the anodes of the tunnel diodes 253′ of the succeeding even stages. Also the even stages are coupled to succeeding odd stages via coupling capacitors 261. The load resistors for the tunnel diodes 253, 253′ and the collector resistors for the transistors 252, 252′ are connected to the positive terminal of a supply source E–10. The supply source E–10 and each shift register stage has a ground connection.

In operation one binary digit, for example a binary "1," is represented in a shift register stage when the tunnel diode of that stage is in the "high" voltage state and the transistor of that state is in the "on" condition. The binary "0" digit is then represented in a stage when the tunnel diode is in the "low" state and the transistor is in the "off" condition.

A binary "1" is stored in a first stage 250 by applying a positive pulse to the input terminal 258 to change the first stage tunnel diode 253 to the "high" state. The transistor 252 of the first stage accordingly is in the "on" condition and its collector electrode is close to ground level. The D.C. collector potential is blocked from the second stage tunnel diode 253′ by the coupling capacitor 260′. A binary "0" is "written" into the first stage by failing to apply an input pulse during an input signal period. Following the input signal period a negative pulse is applied to the odd shift bus 254. This negative pulse changes the tunnel diodes 253 of the odd stages to their "low" states thereby changing the odd stage transistors 252 to the "off" condition. A tunnel diode 253 that is already in its "low" state, corresponding to a binary "0," is not switched by the negative shift pulse but remains in the "low" state. When the first stage transistor 252 changes to the "off" condition a positive going pulse appears at its collector electrode and is coupled via the coupling capacitor 260′ to the anode of the tunnel diode 253′ of the second stage. The second stage tunnel diode 253′ thereupon changes to its "high" state and the second stage transistor 252′ changes to its "on" condition. The first stage tunnel diode remains in its "low" state and the first stage transistor 252 remains in the "off" condition after termination of the odd shift pulse.

Each odd shift pulse is followed by an even shift pulse of negative polarity applied to the even shift bus 255. The negative even shift pulse operates to shift the binary "1" from the second stage to the third stage in similar manner. A new input signal can be applied to the input terminal 258 during or subsequent to each even shift pulse. This new input signal is shifted to the second stage by the next odd numbered shift pulse, and to the third stage by the next even numbered shift pulse. The binary "1" in the third stage is shifted to the fourth stage by the last mentioned odd shift pulse and from the shift register output stage by the next even shift pulse. Separate parallel input lines may be connected to the odd (or even) shift register stages if parallel input is desired.

Figure 11:
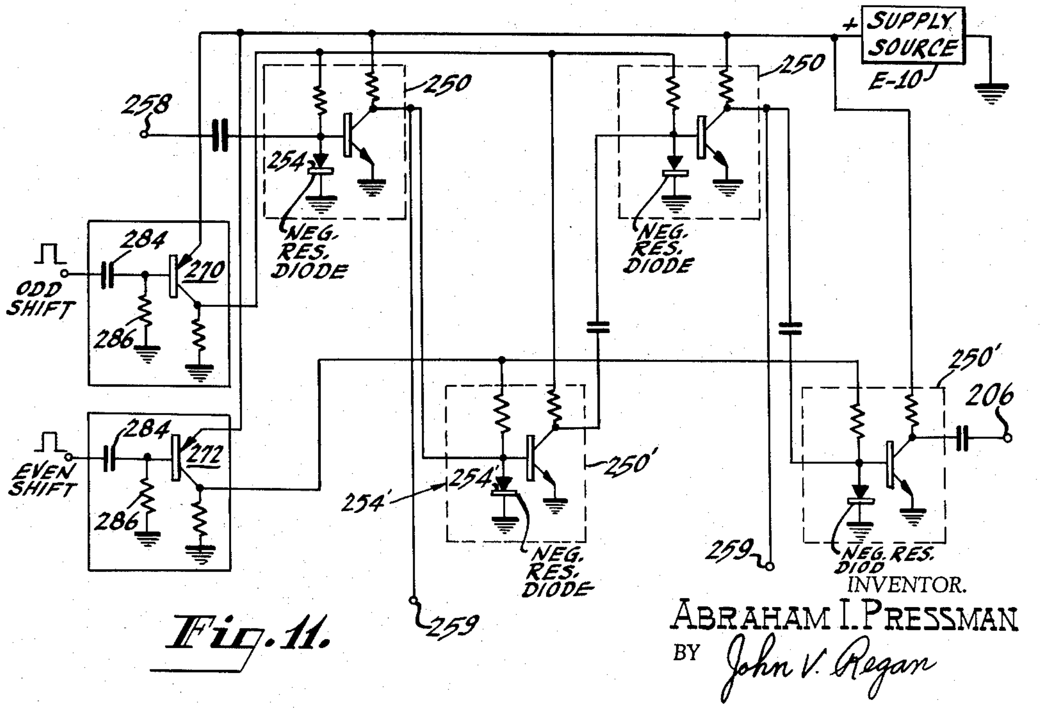
FIG. 11 is a schematic diagram of a shift register circuit according to the invention using common gating arrangements.

The shift register of FIG. 11 employs an odd shift transistor 270 for all the odd numbered stages and an even shift transistor 272 for all the even numbered stages 250'. The shift transistors 270, 272 are of the PNP type connected in a grounded collector configuration between the positive terminal of the supply source E–10 and ground. The collector of the odd shift transistor 270 is connected in parallel to the load resistors of all the odd stage tunnel diodes 254. The collector of the even shift transistor 272 is connected in parallel to all the load resistors of the even stage tunnel diodes 254'. The shift pulses are applied to the shift transistors via an A.C. network comprising a capacitor 284 and a shunt resistor 286 to the base electrode of the gating transistor. The even numbered stages of the shift register are connected in similar manner to the collector electrode of the even shift transistor 272.

In operation, the odd and even shift transistors 270, 272 are normally conducting providing sustaining current for the tunnel diodes 254, 254'. An odd shift pulse of positive polarity causes the odd shift transistor 270 to become non-conductive. Accordingly, the collector of the odd shift transistor falls towards ground potential and the sustaining current is removed from all the odd stage tunnel diodes. Those of the odd stage tunnel diodes which are storing binary "1" digits change from the "high" to the "low" voltage state. The odd stage transistors connected to these tunnel diodes are changed from the "on" to the "off" condition. When an odd stage transistor changes to the "off" condition, a positive going signal is coupled to the succeeding even stage tunnel diode changing it from the "low" to the "high" state. Any odd stage tunnel diode which is storing a binary "0" remains in its "low" voltage state as does the succeeding even stage tunnel diode. Upon termination of the odd shift pulse, the previously stored pattern of binary "1" and "0" digits stored in the odd stage tunnel diodes is shifted by one position and is now stored in the even stage tunnel diodes. All the odd stage tunnel diodes are in their "low" states preparatory to receiving information from the input terminal 258 and the even shift register stages. Similarly, when the even shift transistor 272 is cut off by a positive polarity, even shift pulse, the even numbered stages 250' transmit binary "1" and "0" signals to the next higher odd numbered stages.

What is claimed is:

1. A counter circuit comprising a plurality of stages connected in cascade, each said stage including a transistor having base, emitter and collector electrodes and a negative resistance diode having two stable states connected tot he base electrode, and a two-input "and" gate having its output connected to said diode and one input connected to the collector of a preceding stage transistor, a common input line connected to the other input of each said gate, separate feedback networks each coupling the collector of the transistor of a succeeding stage to the diode of a preceding stage.

2. A shifting circuit comprising a plurality of stages each including a transistor and a tunnel diode connected to apply a base input signal to said transistor, said stages being connected in an ordered arrangement by coupling the transistor of any one stage to the tunnel diode of the succeeding stage in order, means for applying a bias potential to each said tunnel diode sufficient to provide each said tunnel diode with two stable operating states, in one of said states a tunnel diode maintaining its connected transistor in the conducting condition, and in the other of said states a tunnel diode maintaining its connected transistor in the non-conducting condition, means for setting certain of said tunnel diodes in an initial state and at least one of said tunnel diodes in the opposite state, and means for applying successive signals to said circuit, successive ones of said signals operating to shift a stored signal from said one to another of said diodes in succeeding stages.

3. A shifting circuit as recited in claim 2, including a plurality of diode "and" gates each having first and second inputs and an output, said first input of any one gate, except the first stage gate, being connected to the collector of a preceding stage transistor and said one gate output being connected to a succeeding stage tunnel diode, and said signal applying means being connected to said second inputs of all said gates.

4. A shifting circuit as claimed in claim 2, including a common input transistor connected to apply said bias potential to said tunnel diodes, and said successive signals being applied to change said common transistor between conducting and non-conducting conditions.

5. A shifting circuit as claimed in claim 2, including a first shift line coupled to the tunnel diodes of odd-numbered ones of said stages, and a second shift line coupled to the tunnel diodes of even-numbered ones of said stages.

6. A shifting circuit as claimed in claim 2, including a first input transistor connected to apply said bias potential to said tunnel diodes of odd-numbered ones of said stages, and a second input transistor connected to apply said bias potential to said tunnel diodes of even-numbered ones of said stages, and said successive signals being applied alternately to said first and second input transistors.

7. A shifting circuit comprising a plurality of stages each including a transistor and a tunnel diode directly coupled to apply a base input signal to said transistor, a plurality of diode "and" gates each having two inputs and an output, separate networks connecting the output of one of said "and" gates to a succeeding one of said tunnel diodes, each said network including a capacitor and a series diode connected between said "and" gate output and said tunnel diode and a shunt diode connected between said capacitor and said series diode, a charging path for said capacitor including said shunt diode, and a discharge path for said capacitor including said tunnel diode and said series diode, a plurality of other networks, respectively, A.C. coupling the collector of the transistor of one stage to the tunnel diode of a succeeding stage, separate first ones of said diode inputs being connected respectively to the collectors of the transistors of different ones of said stages, and means for applying a shift signal to the second inputs of all said "and" gates.

8. In combination, a plurality of transistors having base, emitter and collector electrodes, a like plurality of negative resistance diodes respectively connected to said transistor base electrodes, said negative resistance diodes each having two stable states, in one of said states a diode holding its connected transistor in a conducting condition and in the other of said states a diode holding its connected transistor in a cut off condition, a like plurality of gating means each having a pair of inputs and an output, said gate outputs being coupled respectively to said diodes, first inputs of said gates being coupled respectively to different ones of said transistor collector electrodes, and means for applying input signals at the same time to the second inputs of said gates.

9. The combination as recited in claim 8, each said gate output coupling including a capacitor and a first unidirectional conducting device connected between said gate output and said negative resistance diode, a common point, and another unidirectional conducting device connected between said capacitor and first unidirectional conducting device at said common point, said other unidirectional device providing a charging path for said capacitor, and said negative resistance diode and said first unidirectional conducting device providing a discharge path for said capacitor, said discharge current changing said diode from said other to said one state.

10. The combination as recited in claim 8 including a like plurality of coupling means each connecting the collectors of other different ones of said transistors and said diodes, respectively, to change a connected diode from said one state to said other state.

11. A gating circuit comprising a negative resistance diode having two stable states, and means for changing said diode from one to the other of said states comprising a capacitor, a charge path for said capacitor including a first unidirectional conducting device, a discharge path for said capacitor including said tunnel diode and another unidirectional conducting device, and means for applying a charging signal to said capacitor, said diode changing from said one to said other state upon removal of said charging signal.

No references cited.